United States Patent

Isac

Patent Number: 6,095,857
Date of Patent: Aug. 1, 2000

[54] ELECTRICAL COMPONENT FOR SURFACE-MOUNTING ON A CIRCUIT BOARD

[75] Inventor: Victor Isac, Montreal, Canada

[73] Assignee: Weco Electrical Connectors, Inc., Canada

[21] Appl. No.: 09/261,248

[22] Filed: Mar. 3, 1999

[51] Int. Cl.$^7$ .................................................. H01R 13/73
[52] U.S. Cl. .............................................. 439/571; 439/83
[58] Field of Search .......................... 439/83, 876, 571, 439/570

[56] References Cited

U.S. PATENT DOCUMENTS

| | | | |
|---|---|---|---|
| 4,678,250 | 7/1987 | Romine et al. | 439/83 |
| 4,682,829 | 7/1987 | Kunkle et al. | 439/83 |
| 5,641,291 | 6/1997 | Sueki et al. | 439/83 |

*Primary Examiner*—Khiem Nguyen
*Assistant Examiner*—Brian S. Webb
*Attorney, Agent, or Firm*—Coudert Brothers

[57] ABSTRACT

A novel surface-mount electrical component for mounting on a circuit board. The electrical component includes at least one pin and a retaining surface. The pin serves as both a point of electrical contact between the electrical component and the circuit board and as a solder-anchoring point. The retaining surface is remote from the pin and serves as an additional solder-anchoring point for restricting the movement of the electrical component on the circuit board. Both the pin and the retaining surface are coplanar, ensuring even soldering of the electrical component to the circuit board.

12 Claims, 2 Drawing Sheets

ELECTRICAL COMPONENT FOR SURFACE-MOUNTING ON A CIRCUIT BOARD

FIELD OF THE INVENTION

The present invention relates to the field of surface-mount electrical components. More specifically, it pertains to a method for mounting and anchoring surface-mount electrical components, such as electrical connectors, to a circuit board.

BACKGROUND OF THE INVENTION

With the advancement of circuit board assembly has come a technique known as surface-mount technology, which consists in the mounting of electronic circuit components and their electrical connections on the surface of a Printed Circuit Board (PCB), rather than through holes. The PCB itself is a flat board whose front contains slots for integrated circuit chips and connections for a variety of electrical components, and whose back is printed with electrically conductive pathways between the components. An example of such an electrical component is the electrical connector which, when mounted on the PCB, creates an interface between discrete wires and the PCB. Automation of the circuit board assembly process typically involves the use of automated pick-and-place machinery for placement of the electrical components onto the PCB.

Existing surface-mount electrical components, such as the electrical connector, are anchored to the PCB by the soldering of their electrical pins to the PCB, where these pins also provide points of electrical contact between the component and the PCB. However, these components often need additional means of mechanical fastening in order to restrict the movement of the components on the PCB, as excessive movement produces undesirable stresses on the electrical pin solder-joints.

Unfortunately, the anchoring systems currently used to fasten surface-mount electrical components to circuit boards have important disadvantages. In the case of metal or plastic clips, excessively high insertion forces are required from the pick-and-place machines in an automated assembly, and access to the opposite side of the PCB may require drilling of the PCB. In the case of threaded fasteners, automation of the assembly is rendered very difficult.

The background information herein clearly shows that there exists a need in the industry to provide an improved method for anchoring surface-mount electrical components to a circuit board.

SUMMARY OF THE INVENTION

The invention resides in a novel electrical component for surface-mounting on a circuit board. The electrical component includes at least one electrical pin, serving as both a point of electrical contact between the electrical component and the circuit board and as a point of solder-anchoring. The electrical component further includes a novel anchoring system. The anchoring system comprises a retaining surface, coplanar with the electrical pin. The retaining surface is also capable of being solder-anchored to the circuit board, thus restricting the movement of the electrical component on the circuit board and eliminating undesirable stresses on the electrical pin solder-joints.

The electrical component, including the novel anchoring system, requires zero insertion force to be mounted on the circuit board. The automation of the surface-mount assembly operation is thus greatly simplified, with no drilling of the circuit board or access to the opposite side of the circuit board required.

BRIEF DESCRIPTION OF THE DRAWINGS

These and other features of the present invention will become apparent from the following detailed description considered in connection with the accompanying drawings. It is to be understood, however, that the drawings are provided for purposes of illustration only and not as a definition of the boundaries of the invention, for which reference should be made to the appending claims.

DESCRIPTION OF A PREFERRED EMBODIMENT

Figure 1:
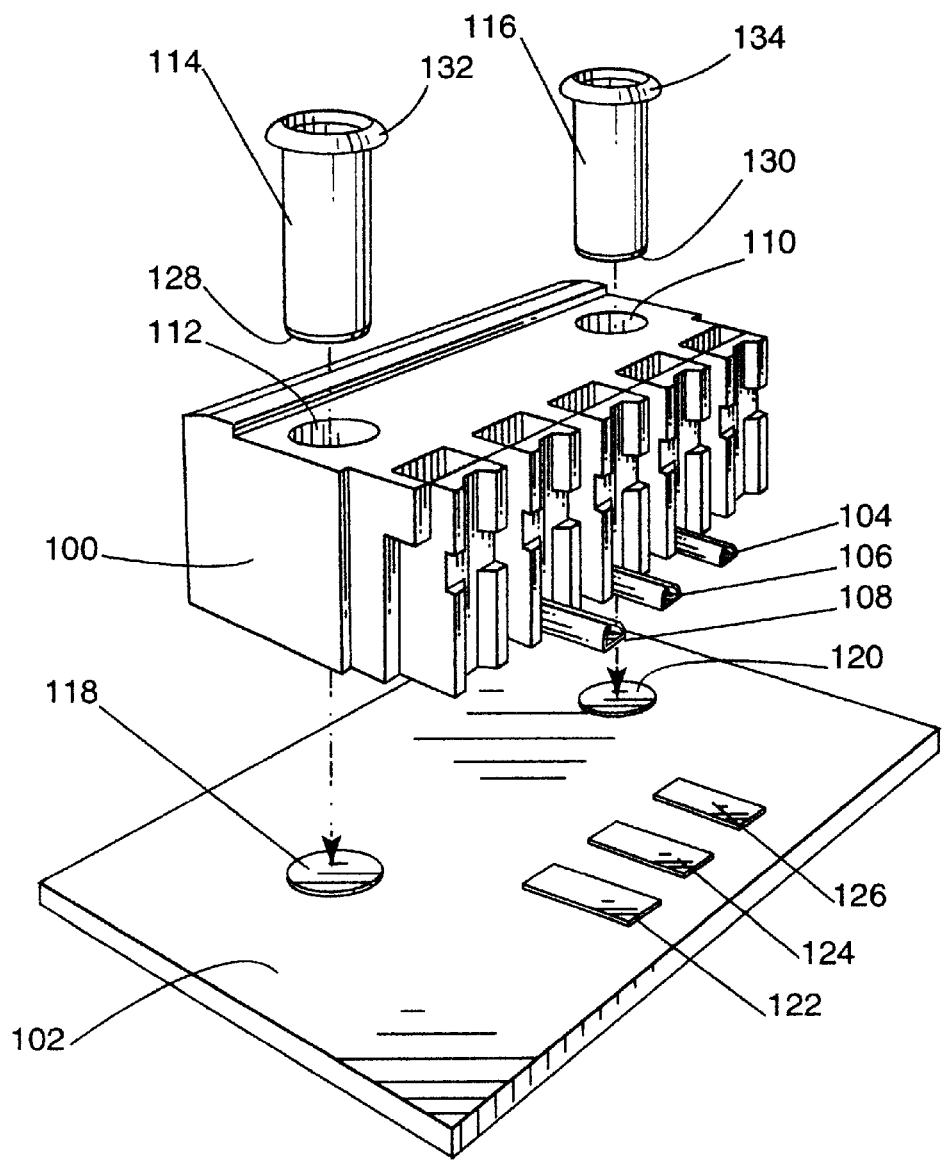
FIG. 1 is a perspective exploded view of a surface-mount electrical connector block, in accordance with the present invention, shown in position to be mounted on a PCB.

In a specific example, the electrical component to be surface-mounted on a PCB is an electrical connector block, as shown in FIG. 1. The connector block 100 is made of an insulating material, such as plastic, and is molded to include at least one point of connection for interfacing with a mating component or with discrete wires. The connector block 100 further includes pins 104, 106 and 108, and two cylindrical apertures 110 and 112. The pins serve as electrical contacts between the connector block 100 and the PCB 102, while apertures 110 and 112 form a part of the anchoring system for the connector block 100. The anchoring system further includes two cylindrical anchors 114 and 116, having end surfaces 128 and 130. These end surfaces will hereafter be referred to as retaining surfaces, and will be described from a functional point of view in further detail below. Anchors 114 and 116 are hollow and include radially outwardly projecting shoulders 132 and 134, respectively. Each shoulder is designed to form an abutment against the upper surface of the connector block 100 when its respective anchor is inserted into one of the apertures in the connector block 100. The length of anchors 114 and 116, between the lower edge of shoulders 132 and 134, respectively, and the retaining surfaces 128 and 130, respectively, is substantially equivalent to the thickness of the connector block 100. Thus, when the anchors 114 and 116 are inserted into apertures 112 and 110, respectively, the retaining surfaces 128 and 130 are coplanar with pins 104, 106 and 108. The circular cross-section diameter of the cylindrical anchors 114 and 116 is such that the anchors fit tightly into apertures 112 and 110, respectively.

The PCB 102 may include multiple integrated circuit chips and connections for a variety of other electrical components, none of which are shown in FIG. 1 in the interest of clarity. The PCB 102 further includes a plurality of solder pads that also form a part of the anchoring system. Solder pads 122, 124 and 126 are matched in shape, size and spacing with pins 108, 106 and 104, respectively, and serve as points of electrical contact as well as anchoring points once soldered with the pins. Solder pads 118 and 120 are matched in shape, size and spacing with the retaining surfaces 128 and 130 of anchors 114 and 116, respectively, and serve as additional anchoring points once soldered with the anchors.

In use, the connector block 100 is fitted with the anchors, whereby anchors 114 and 116 are inserted into apertures 112 and 110, respectively. The dimension matching between anchors and apertures ensures that once the anchors are fitted into the apertures, they are tightly retained in place by friction forces. The anchor-fitted connector block 100 is next placed on the PCB 102, positioned such that the pins 104, 106 and 108 are aligned with solder pads 126, 124 and 122, respectively, and the retaining surfaces 128 and 130 are aligned with solder pads 118 and 120, respectively. The placement of the anchor-fitted connector block 100 onto the PCB 102 may be performed by pick-and-place machinery in an automated assembly operation, particularly because the connector block 100 need not be pushed onto the PCB 102. In effect, the mounting of the anchor-fitted connector block 100 onto the PCB 102 requires zero-insertion force, an important advantage of this novel anchoring system.

Figure 2:
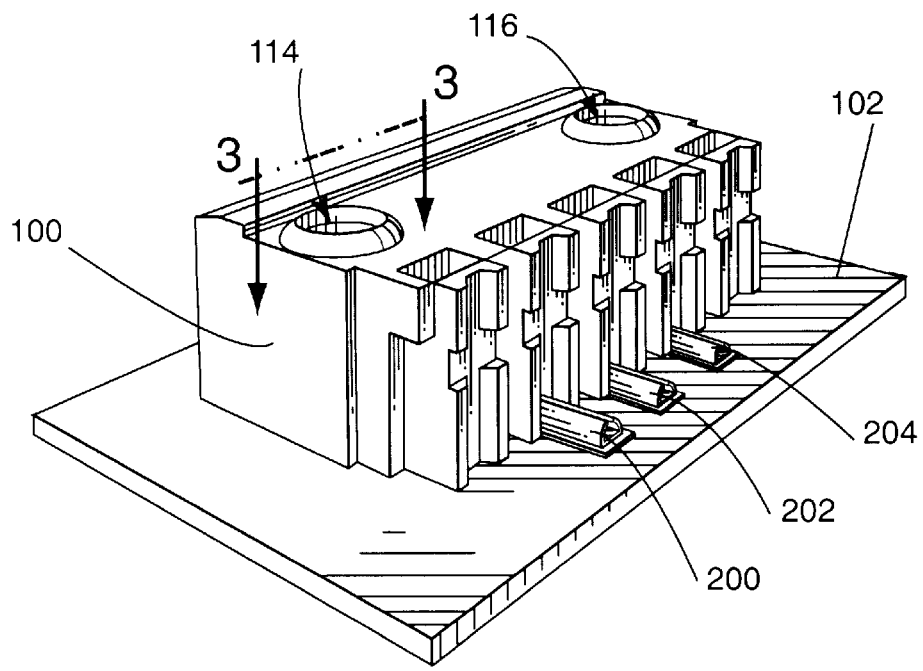
FIG. 2 is an assembled view of the surface-mounted electrical connector block shown in FIG. 1, on the PCB.

Once properly positioned on the PCB 102, the connector block pins 104, 106 and 108, as well as the retaining surfaces 128 and 130, are soldered to the PCB 102. Since retaining surfaces 128 and 130 are coplanar with pins 104, 106 and 108, an even soldering between the connector block 100 and the PCB 102 is assured. The mounted anchor-fitted connector block 100 is shown in FIG. 2. The tight fit of the anchors 114 and 116 in the connector block 100 restricts the movement of the latter on the PCB 102, thus eliminating undesirable stresses on the electrical pin solder-joints 200, 202 and 204. Note that anchors 114 and 116 form no part of, and do not interfere with, the electrical contact between the connector block 100 and the PCB 102. This is ensured by the positioning of the anchors in the connector block 100 such that they are spaced apart from connector pins 104, 106 and 108, which serve as the points of electrical contact between the connector block 100 and the PCB 102.

Figure 3:
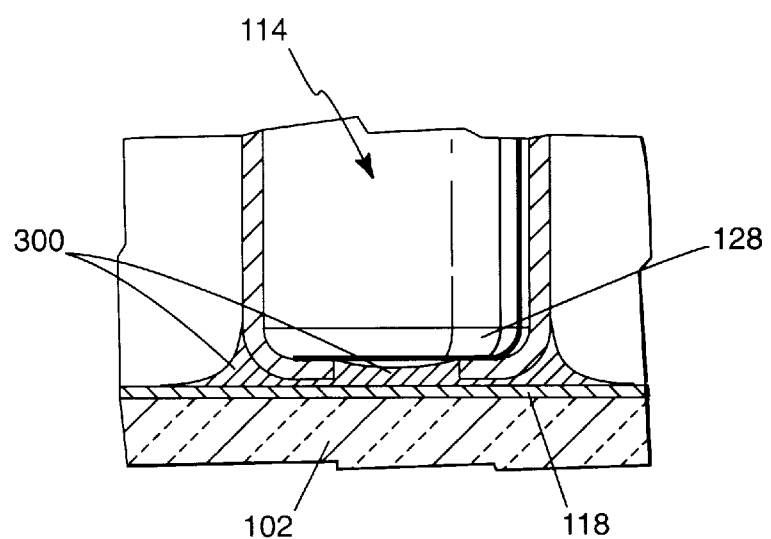
FIG. 3 is a cross-sectional view taken along lines 3—3 of FIG. 2.

The retaining surfaces 128 and 130 of the anchors are thin enough to allow for quick heating to soldering temperatures. As such a characteristic is common to typical solder contacts and is well known to those skilled in the art, it will not be described in further detail. More importantly, the retaining surfaces 128 and 130 are pierced to allow molten solder to flow in, thus maximizing the solder-joint area. Taking for example anchor 114, FIG. 3 shows that anchor 114 rests on solder pad 118 of the PCB 102, surrounded at its retaining surface 128 by solder 300. The retaining surface 128 is pierced, providing more area for contact between the solder 300 and the retaining surface 128. The greater the solder-joint area, the greater the anchoring force securing the connector block 100 to the PCB 102.

In an alternative embodiment, the retaining surfaces may be an integral part of the connector block. For example, the retaining surfaces may be metallic elements embedded in the plastic molding of the base of the connector block. Further, the connector block may include a single retaining surface of greater area, or a plurality of retaining surfaces positioned strategically about the base of the connector block, so as to eliminate undesirable movement of the connector block on the PCB.

The above description of a preferred embodiment under the present invention should not be read in a limitative manner as refinements and variations are possible without departing from the spirit of the invention. The scope of the invention is defined in the appended claims and their equivalents.

I claim:

1. An electrical component for mounting on a circuit board, said electrical component comprising:

a body made of electrically insulating material;

an electrical link on said body for establishing with the circuit board a state of electrical interaction permitting an exchange of signals between said electrical component and the circuit board, said electrical link including at least one pin, said pin having a portion capable of being solder anchored to the circuit board;

a retaining surface mounted to said body and capable of being solder anchored to the circuit board, said retaining surface being co-planar with said portion, said retaining surface being remote from said pin and being excluded from the electrical interaction between the circuit board and said electrical link, such that no one of the signals exchanged between said electrical component and the circuit board travels on said retaining surface.

2. An electrical component as defined in claim 1, wherein said electrical component is an electrical connector.

3. An electrical component as defined in claim 1, wherein the body of said electrical component includes a top surface and a bottom surface.

4. An electrical component as defined in claim 3, wherein said retaining surface is coplanar with said bottom surface.

5. An electrical component as defined in claim 4, wherein said retaining surface includes a recess for receiving solder.

6. An electrical component as defined in claim 5, wherein said recess is an aperture.

7. An electrical component as defined in claim 3, wherein said electrical component includes an anchor having a base, said base forming at least a portion of the retaining surface.

8. An electrical component as defined in claim 7, wherein said anchor is removably mounted to said electrical component.

9. An electrical component as defined in claim 8, wherein said anchor is an elongated body mounted into an aperture in said electrical component.

10. An electrical component as defined in claim 9, wherein said anchor includes a radially outwardly projecting shoulder, said shoulder forming an abutment against said top surface of the body of said electrical component when said anchor is mounted into said aperture.

11. An electrical component as defined in claim 10, wherein said anchor is frictionally secured in said aperture.

12. A method for mounting the electrical component defined in claim 1 on a circuit board, said method comprising:

aligning said portion with a solder pad on the circuit board;

aligning said retaining surface with a solder pad on the circuit board;

soldering said portion and said retaining surface to the circuit board.

* * * * *